(12) United States Patent
Ha et al.

(10) Patent No.: US 8,866,216 B2
(45) Date of Patent: Oct. 21, 2014

(54) SEMICONDUCTOR DEVICE AND METHOD FOR FABRICATING THE SAME

(75) Inventors: Ga Young Ha, Icheon-si (KR); Chang Jun Yoo, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 442 days.

(21) Appl. No.: 13/183,498

(22) Filed: Jul. 15, 2011

(65) Prior Publication Data

US 2012/0012926 A1 Jan. 19, 2012

(30) Foreign Application Priority Data

Jul. 16, 2010 (KR) ........................ 10-2010-0068902

(51) Int. Cl.
*H01L 29/78* (2006.01)
*H01L 21/336* (2006.01)
*H01L 27/108* (2006.01)

(52) U.S. Cl.
CPC ...... *H01L 29/7827* (2013.01); *H01L 27/10876* (2013.01); *H01L 27/10823* (2013.01); *H01L 27/10885* (2013.01)
USPC ...... 257/330; 257/306; 257/329; 257/E21.41; 257/E29.262

(58) Field of Classification Search
CPC . H01L 27/105; H01L 27/11; H01L 29/66666; H01L 29/78618; H01L 27/7848; H01L 27/088; H01L 27/11582; H01L 27/1211; H01L 21/36; H01L 21/76224; H01L 21/82385; H01L 29/0847; H01L 29/105
USPC ............. 257/330, E21.41, E29.262, 306, 329
See application file for complete search history.

(56) References Cited

U.S. PATENT DOCUMENTS

| 2011/0121284 A1 | 5/2011 | Yamazaki et al. |
| 2011/0140187 A1 | 6/2011 | Lindholm et al. |
| 2012/0270374 A1* | 10/2012 | Masuoka et al. ............. 438/268 |

FOREIGN PATENT DOCUMENTS

| JP | 2007194267 A | 8/2007 |
| KR | 1020090022759 A | 3/2009 |
| KR | 1020090099774 A | 9/2009 |
| KR | 1020110078022 A | 7/2011 |

* cited by examiner

*Primary Examiner* — Cathy N Lam
(74) *Attorney, Agent, or Firm* — William Park & Associates Patent Ltd.

(57) ABSTRACT

A method for fabricating a semiconductor memory device includes defining an active region having a shape protruding upward by forming a trench in a semiconductor substrate; forming an open region obtained by selectively exposing a lower side portion of the active region while forming a sidewall layer along the shape of the active region; covering the open region with a silicon layer; forming an impurity region in the lower side portion of the active region; forming a barrier metal layer on the silicon layer and the active region; forming a bit line metal layer buried in the entire active region; and forming a buried bit line having the barrier metal layer, the bit line metal layer and a silicide metal layer formed between the silicon layer and the barrier metal layer by etching the bit line metal layer up to a portion at which the impurity region is formed.

5 Claims, 11 Drawing Sheets

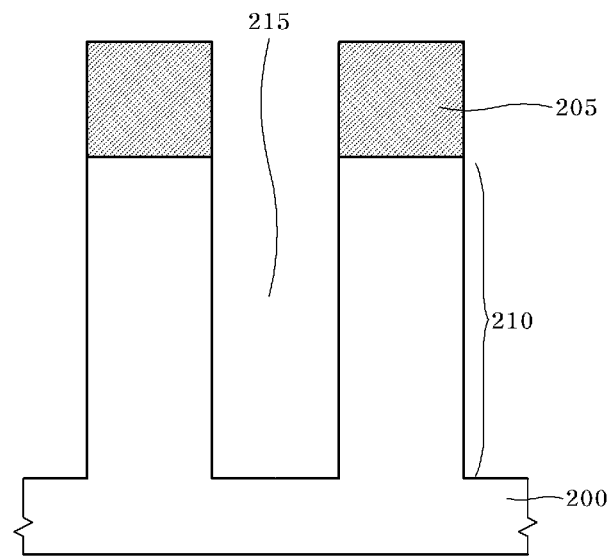
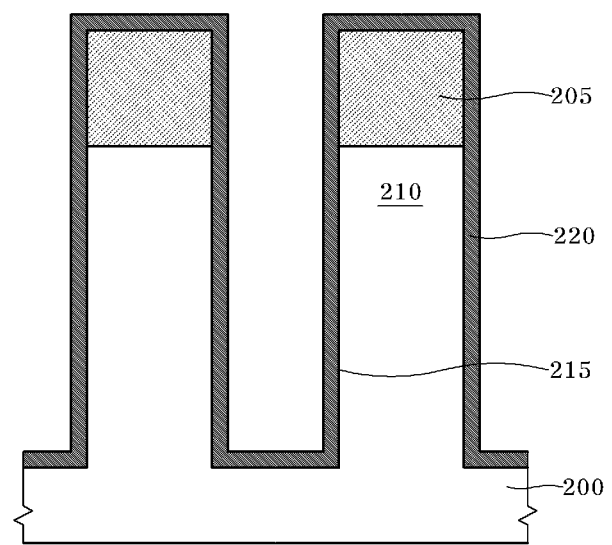

SEMICONDUCTOR DEVICE AND METHOD FOR FABRICATING THE SAME

CROSS-REFERENCES TO RELATED APPLICATIONS

The present application claims priority under 35 U.S.C 119(a) to Korean Application No. 10-2010-0068902, filed on Jul. 16, 2010, in the Korean Intellectual Property Office, which is incorporated herein by reference in its entirety.

BACKGROUND

Exemplary embodiments of the present invention relate generally to a semiconductor device, and more particularly, to a semiconductor memory device and a method for fabricating the same.

With broadening uses of mobile devices and continued miniaturization thereof, the efforts to highly integrate the semiconductor devices continue. In the case of a dynamic random access memory (DRAM) device or flash memory device, various attempts have been made to form more memory cells in a small area. The DRAM device comprises a transistor and a capacitor in its memory cell, and a known DRAM device comprises a transistor with a planar structure.

Also, a storage node contact is formed between a source region formed of the transistor and the capacitor to electrically connect the transistor to the capacitor. A drain region of the transistor is electrically connected to a bit line through a bit line contact. In a structure in which a capacitor is formed over the transistor with the planar structure, layers for signal transmission, such as word and bit lines are arranged between the transistor and the capacitor. There is a limitation in increasing the capacitance of the capacitor due to the space occupied by the layers. Moreover, if the width of a gate of the transistor with the planar structure is narrowed by 40 nm or less, the amount of body current that is a leakage current between source and drain regions may increase. Therefore, a vertical transistor with a vertical channel is being developed.

FIG. 1 is a cross-sectional view illustrating a vertical transistor.

Referring to FIG. 1, the vertical transistor 100 has a structure in which a drain region 112 is formed at a lower side of a silicon semiconductor substrate 110 and a source region 114 is formed at an upper side of the silicon semiconductor substrate 110. A channel region 116 is formed between the drain and source regions 112 and 114, and a gate insulating layer 118 and a gate electrode 120 are sequentially formed on a side of the silicon semiconductor substrate 110 in the channel region 116. In the case where the vertical transistor 100 is used as a switching element of a DRAM device, a bit line is connected to the drain region 112, and a storage node is connected to the source region 114. Since the bit line is arranged to be buried at a lower side of the silicon semiconductor substrate 110, a space in which the storage node is to be formed may increase compared with the DRAM device comprising the transistor with the planar structure, and accordingly, data storage ability may be improved even at a degree of high integration.

In order to form the vertical transistor described above, the drain region 112 is formed at the lower side of the silicon semiconductor substrate 110, but this process is not easy to perform. For example, before the drain region 112 is formed, a high-concentration doped region is formed on a lower side of the silicon semiconductor substrate 110, at which the drain region 112 is to be formed, and dopants in the doped region is diffused, thereby forming the drain region 112. However, with the degree of high integration of the semiconductor device, the size of the memory cell decreases, and thus it is not easy to precisely form the drain region 112.

SUMMARY

Embodiments of the present invention relate to a semiconductor memory device and a method for fabricating the same capable of improving contact resistance characteristics of a buried bit line which contacts a drain region through a single sidewall contact in a process of forming the buried bit line of a vertical transistor and ensuring stability and reliability of the device.

In an embodiment, a method for fabricating a semiconductor memory device includes defining an active region having a shape protruded upward by forming a trench in a semiconductor substrate; forming an open region obtained by selectively exposing a lower side portion of the active region while forming a sidewall layer extended along the shape of the active region; burying the open region with a silicon layer; forming an impurity region in the lower side portion of the active region covered with the silicon layer; forming a barrier metal layer on the silicon layer and the active region; forming a bit line metal layer buried in the entire active region; and forming a buried bit line having the barrier metal layer, the bit line metal layer and a silicide metal layer formed between the silicon layer and the barrier metal layer by etching the bit line metal layer up to a portion at which the impurity region is formed.

The sidewall layer may include an oxide or nitride layer.

The silicon layer may be buried up to the same height as the surface of the sidewall layer.

The silicon layer may be protruded to partially cover the sidewall layer.

The silicon layer may be formed using a method of selectively growing silicon by supplying a silicon deposition source on the active region exposed by the open region.

The silicon deposition source may be a mixed gas of dichlorosilane ($SiCl_2H_2$) gas, phosphine ($PH_3$) gas and hydrogen chloride (HCl) gas.

The silicon deposition source may be supplied by controlling the supply amount of the silicon deposition source so that the silicon layer partially covers the sidewall layer at the circumference of the open region and is grown in a horizontal direction.

The silicon layer may be formed not to exceed ½ of the width of the trench formed between the active regions.

The forming of the impurity region may include performing an ion implantation process of implanting an impurity on the silicon layer, after the forming of the silicon layer; and performing an annealing process of diffusing the implanted impurity in the direction of the active region.

The barrier metal layer may include a titanium (Ti) or titanium nitride (TiN) layer, and the metal layer may include a tungsten (W) layer.

The silicide metal layer may be formed along a surface that contacts the barrier metal layer. The silicide metal layer may be formed at an interface with the barrier metal layer by a silicide reaction induced by contacting the silicon layer with the barrier metal layer.

According to embodiments of the present invention, the production of a void is prevented by forming an SEG layer at a single sidewall contact portion, so that it is possible to improve contact characteristics between a drain region and a buried bit line.

Further, the contact area of the buried bit line is increased by forming the SEG layer to be protruded outward from a single sidewall contact hole, so that it is possible to decrease contact resistance.

Furthermore, an impurity is implanted in the protruded portion of the SEG layer, so that it is possible to more easily perfume an ion implantation process for forming an impurity region.

BRIEF DESCRIPTION OF THE DRAWINGS

The above and other aspects, features and other advantages will be more clearly understood from the following detailed description taken in conjunction with the accompanying drawings, in which:

FIGS. 2 to 14 are cross-sectional views illustrating a semiconductor memory device and a method for fabricating the same according to an embodiment of the present invention.

DESCRIPTION OF SPECIFIC EMBODIMENTS

Figure 1:
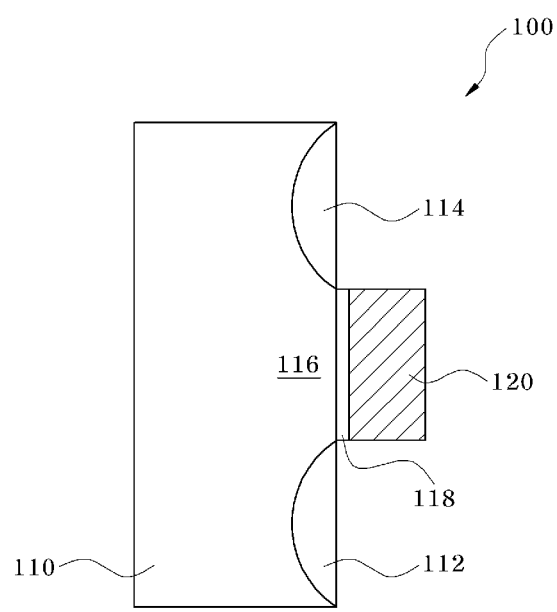
FIG. 1 is a cross-sectional view illustrating a vertical transistor.

Hereinafter, embodiments of the present invention will be described with reference to accompanying drawings. However, the embodiments are for illustrative purposes only and are not intended to limit the scope of the invention.

FIGS. 2 to 14 are cross-sectional views illustrating a semiconductor memory device and a method for fabricating the same according to an embodiment of the present invention.

Referring to FIG. 2, a trench 215 is formed in the semiconductor substrate 200. Specifically, a hard mask layer pattern 205 is formed on the semiconductor substrate 200. The hard mask layer pattern 205 selectively exposes a surface of the semiconductor substrate 200 in a region in which an active region 210 is to be formed, and may include a nitride or oxide layer. Subsequently, the trench 215 is formed in the semiconductor substrate 200 by etching the exposed portion of the semiconductor substrate 200 using the hard mask layer pattern 205 as an etching mask. The trench 215 defines the active region 210 in which a vertical transistor is to be formed in the semiconductor substrate 200, and also allows the defined active region 210 and another active region 210 adjacent thereto to be isolated from each other. Accordingly, the active region 210 is formed in the shape of a pillar protruding upward.

Referring to FIG. 3, a sidewall layer 220 is formed on exposed surfaces of the pillar-shaped active region 210 and the trench 215. The sidewall layer 220 may include an oxide or nitride layer.

Figure 4:
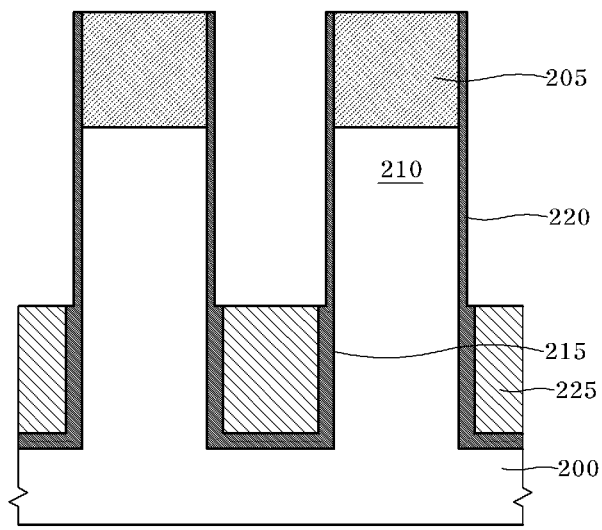

Referring to FIG. 4, a sacrificial layer 225 is formed to be partially filled in the trench 215 (see FIG. 2). Here, the sacrificial layer 225 functions to selectively expose a region in which an open region of a drain region is to be formed later. To this end, a sacrificial layer material is formed on the pillar-shaped active region 210 and the trench 215. Subsequently, a surface of the sacrificial layer material is polished through a planarization process, e.g., a chemical mechanical polishing (CMP) process, and the sacrificial layer 225 in the trench 215 is partially removed through an etch back process. Consequently, at least the bottom portion of the trench 215 is filled with a sacrificial layer material. Next, sidewalls of the active region 210 and the sidewall layer 220 that covers an upper surface of the hard mask layer pattern 205 are recessed inward in the etch back process of the sacrificial layer, so that the sidewall layer 220 remains on the sidewalls of the active region 210 with a thickness that is less than ½ of an initial thickness of the sidewall layer 220. The sacrificial layer material may include an undoped polysilicon layer.

Figure 5:
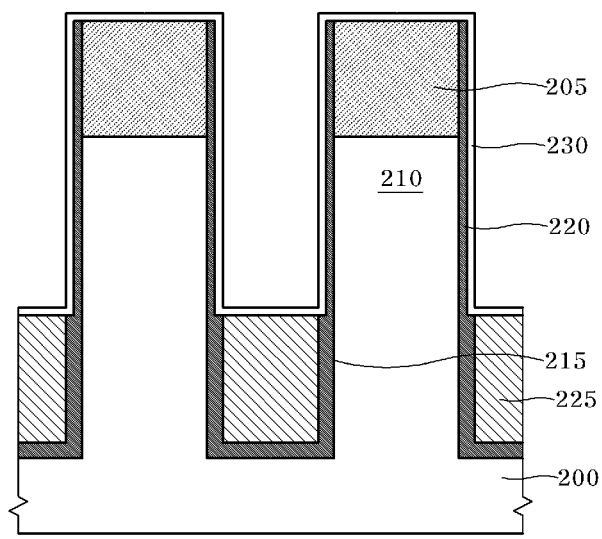

Referring to FIG. 5, a liner layer 230 is formed on the semiconductor substrate 200. The liner layer 230 is formed to be extended along exposed surfaces of the sacrificial layer 225, the recessed sidewall layer 220 and the hard mask layer pattern 205, and may include a nitride or oxide layer.

Figure 6:
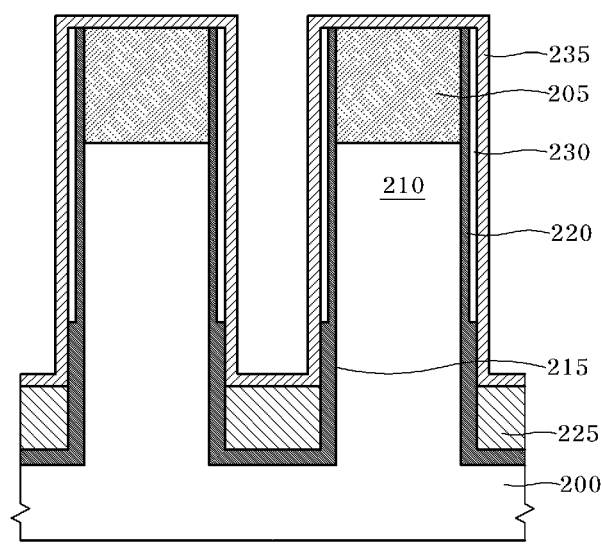

Referring to FIG. 6, a barrier layer 235 is formed on the semiconductor substrate 200. The barrier layer 235 is formed to be extended along exposed surfaces of the sacrificial layer 225 and the liner layer 230, and may include a titanium nitride (TiN) layer.

Figure 7:
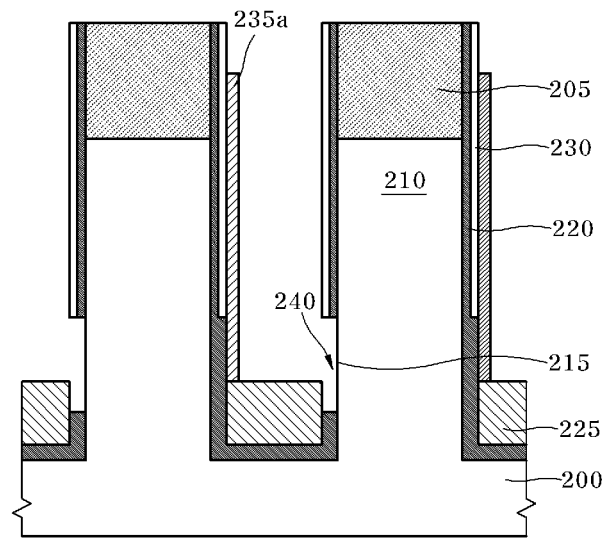

Referring to FIG. 7, the barrier layer 235 formed at a side portion of the active region 210 is selectively removed. Then, the liner layer 230 and the recessed sidewall layer 220, which are in contact with the open region of the drain region, are exposed. Subsequently, a side of the active region 210 is exposed by selectively removing the exposed liner layer 230 and recessed sidewall layer 220 positioned at a lower portion of the active region 210. As described above, the exposed region of the active region 210 becomes an open region 240 of the drain region. In this case, a barrier layer 235a that covers another side portion of the active region 210 functions to protect the another side portion of the active region 210 while removing the liner layer 230 and the sidewall layer 220.

Figure 8:
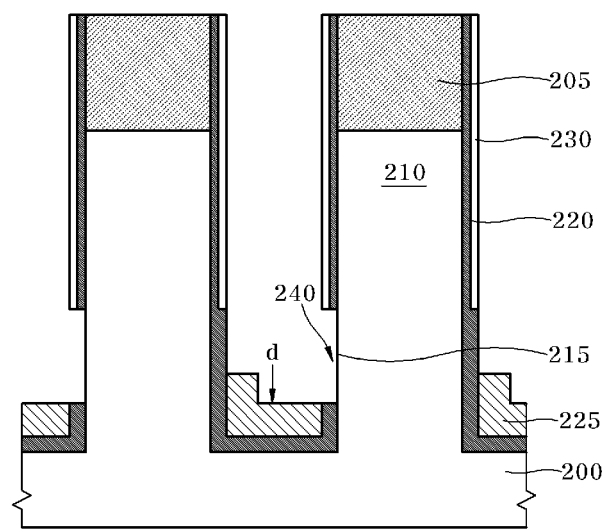

Referring to FIG. 8, the barrier layer 235a positioned opposite to the side portion of the active region 210 having the open region 240 of the drain region is removed. The barrier layer 235a may be removed by supplying an etch source capable of removing the titanium nitride layer. In the process of removing the barrier layer 235a, the sacrificial layer pattern 225 is also removed by a certain depth d together with the barrier layer 235a so as to increase the exposed portion of a region adjacent to the open region 240 of the drain region.

Figure 9:
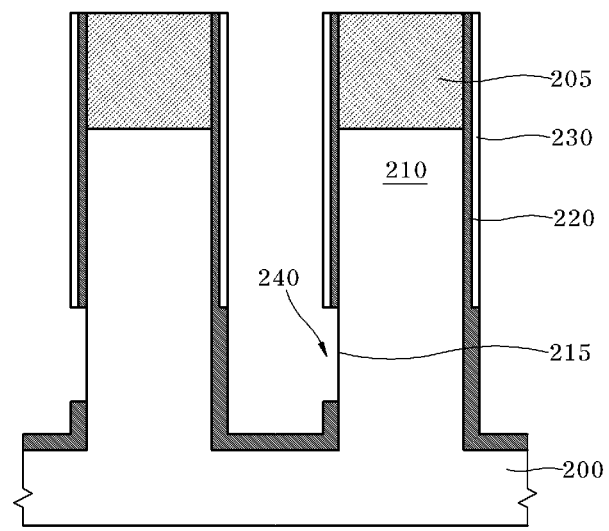

Referring to FIG. 9, the sacrificial layer 225 is removed. The sacrificial layer 225 may be removed by supplying an etch source capable of removing the polysilicon. Accordingly, a bottom portion of the sidewall of the trench 215 220 is exposed.

Figure 10:
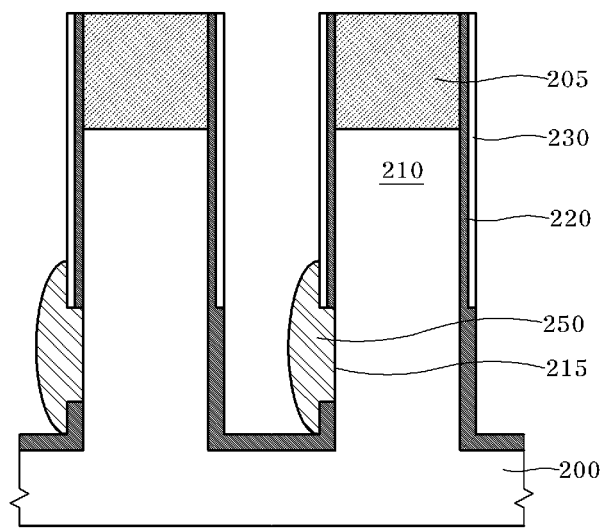

Referring to FIG. 10, a selective epitaxial growth (SEG) layer 250 is formed on the open region 240 of the drain region. The SEG layer 250 may be formed using an SEG method for selectively growing silicon (Si) by supplying a silicon source on the silicon in the active region 210 exposed by the open region 240 of the drain region. Specifically, a silicon deposition source is supplied on the active region 210 exposed by the open region 240 of the drain region. Here, the silicon deposition source may include a mixed gas of dichlorosilane ($SiCl_2H_2$) gas, phosphine ($PH_3$) gas and hydrogen chloride (HCl) gas. In this case, the phosphine ($PH_3$) gas and the hydrogen chloride (HCl) gas are sources capable of controlling the growth speed of the SEG layer, and the SEG layer may be grown in a horizontal direction so as to cover the sidewall layer 220 and the liner layer 230 on and around the open region 240 of the drain region, by controlling the supply amount of the phosphine ($PH_3$) gas and the hydrogen chloride (HCl) gas. The SEG layer 250 grown as described above may be formed not to exceed ½ of the width of the trench 215. Here, the SEG layer 250 may be formed while not covering a higher portion from a bottom of the trench than the open region 240 of the drain region.

Figure 11:
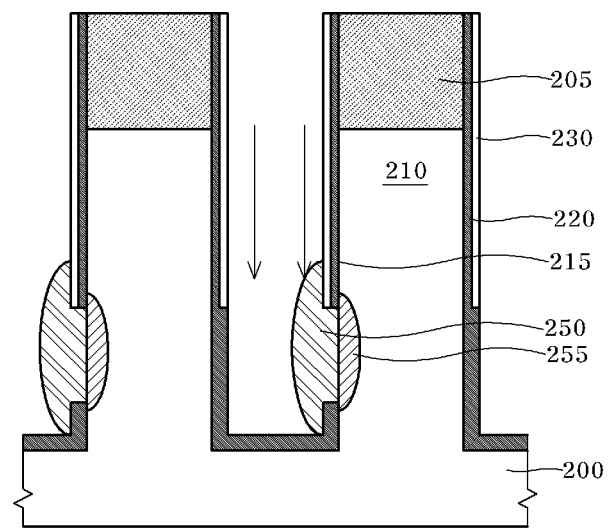

Referring to FIG. 11, an ion implantation process, for forming a drain region 255 to be connected to a buried bit line, is performed at the active region 210 exposed by the open region 240 (see FIG. 9) of the drain region. If the ion implantation process is performed as indicated by arrow, an impurity is easily implanted in the protruding portion of the SEG layer 250. If an annealing process is performed, the drain region 255 is formed while the impurity implanted in the SEG layer 250 is diffused in the direction of the active region 210. Subsequently, the liner layer 230 remaining on the sidewall of the active region 210 may be removed by performing a cleansing process. A subsequent process may be performed after the surface of the SEG layer 250 is planarized by etching the protruding portion of the SEG layer 250.

Figure 12:
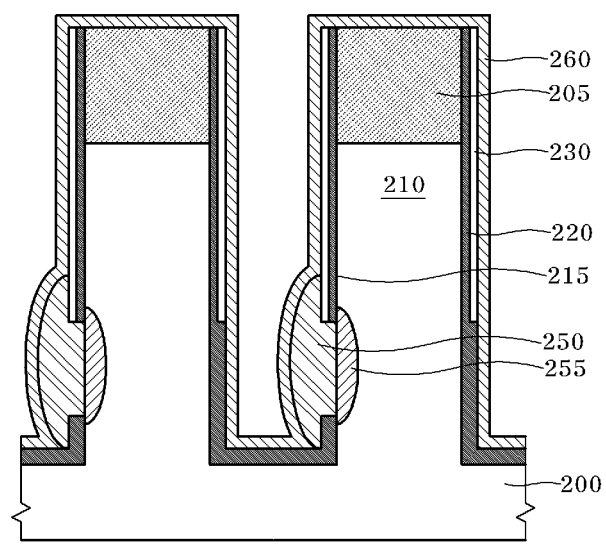

Referring to FIG. 12, a barrier metal layer 260 is formed on the semiconductor substrate 200 having the active region 210. The barrier metal layer 260 is formed along the exposed surfaces of the sacrificial layer pattern 225 and the liner layer 230, and may form a single-layered or stacked structure of a titanium (Ti) or titanium nitride (TiN) layer. Next, a bit line metal layer 265 is formed on the barrier metal layer 260. The bit line metal layer 265 may be formed to cover the entire active region 210. In the process of covering the entire active region 210 with the barrier metal layer 260 and the bit line metal layer 265, a silicide reaction is generated between the SEG layer 260 and the barrier metal layer 260 at a portion in contact with the SEG layer 250. Accordingly, the barrier metal layer 260 at the portion in contact with the SEG layer 250 is transformed to a silicide metal layer 270, e.g., a titanium silicide (TiSi) layer, as shown in FIG. 13.

Figure 13:
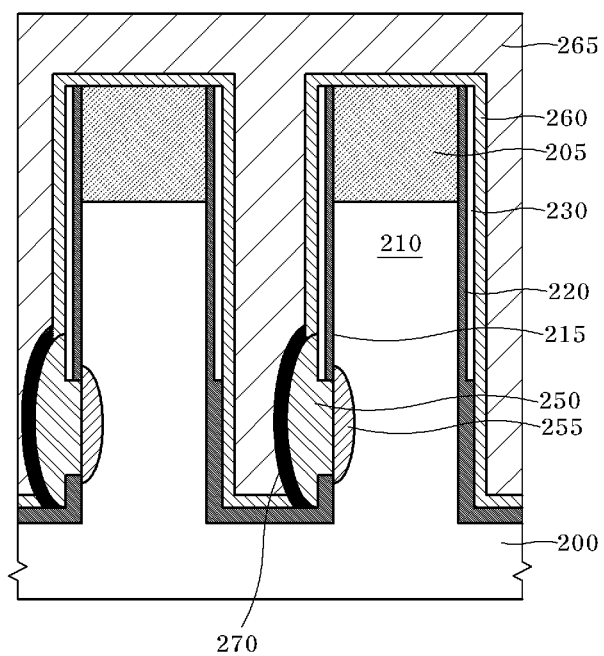
Figure 14:
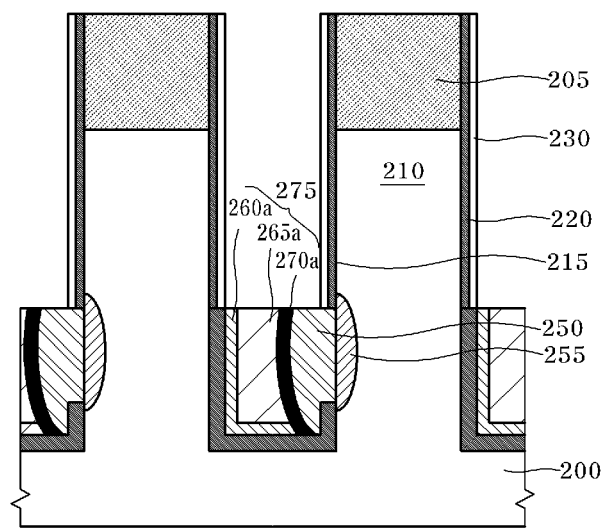

Referring to FIG. 14, a buried bit line 275 that partially fills a lower portion of the trench 215 (see FIG. 10) is formed by performing an etch back process on the bit line metal layer 265 (see FIG. 13). The buried bit line 275 includes a bit line metal layer pattern 265a, a barrier metal layer pattern 260a and a silicide metal layer 270a that covers the surface of the SEG layer 250. As the silicide metal layer 270a is formed along the shape of the protruding portion of the SEG layer 250, the contact area of the buried bit line 275 increases, thereby decreasing contact resistance.

In a case where an open region of a drain region, which exposes a side portion of an active region is formed to form a buried bit line, the portion exposed by the open region of the drain region is formed in the shape of a negative slope. In the process of forming the buried bit line, a void may be produced between the open region of the drain region and the buried bit line, and therefore, it is difficult to contact a lower drain region at a sidewall of the active region with the buried bit line. However, in the present invention, the production of a void may be reduced/minimized by forming the SEG layer in the open region of the drain region, and thus the contact characteristic between the drain region and the buried bit line may be improved. Further, the contact area of the buried bit line increases by forming the SEG layer protruding from the open region of the drain region, and thus contact resistance may decrease. Furthermore, the impurity is implanted in the protruding portion of the SEG layer, and thus an ion implantation process for forming an impurity region may be performed easily.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
    an active region having a pillar-shaped protrusion, which protrudes upward from a substrate and the pillar-shaped protrusion is arranged next to a trench formed on a substrate;
    an impurity region formed at one side portion of the pillar-shaped protrusion; and
    a buried bit line composed of a selective epitaxial growth (SEG) layer formed to become in direct contact with the impurity region at a side portion of the trench, a silicide metal layer formed on the SEG layer, and a bit line metal layer formed on the silicide metal layer thereby the bit line metal layer is apart from the impurity region by the silicide metal layer.

2. The semiconductor memory device of claim 1, wherein the SEG layer is formed using an SEG method of selectively growing silicon by supplying a silicon source to a lower side portion of the pillar-shaped protrusion of the active region.

3. The semiconductor memory device of claim 1, wherein the SEG layer protrudes from the impurity region so as to have a thickness that does not exceed ½ of the width of the trench.

4. The semiconductor memory device of claim 1, wherein the silicide metal layer is formed along a shape of a surface of the SEG layer.

5. The semiconductor memory device of claim 1, wherein the silicide metal layer is formed on a lateral side of the SEG layer and the bit line metal layer is formed on a side of the silicide metal layer.

* * * * *